United States Patent
Chen

(10) Patent No.: US 10,429,707 B2
(45) Date of Patent: Oct. 1, 2019

(54) PIXEL STRUCTURE AND DISPLAY PANEL

(71) Applicants: HKC Corporation Limited, Shenzhen (CN); Chongqing HKC Optoelectronics Technology Co., Ltd., Chongqing (CN)

(72) Inventor: Yu-Jen Chen, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 154 days.

(21) Appl. No.: 15/566,581

(22) PCT Filed: May 26, 2017

(86) PCT No.: PCT/CN2017/086152
§ 371 (c)(1),
(2) Date: Oct. 13, 2017

(87) PCT Pub. No.: WO2018/120623
PCT Pub. Date: Jul. 5, 2018

(65) Prior Publication Data
US 2019/0049802 A1 Feb. 14, 2019

(30) Foreign Application Priority Data
Dec. 30, 2016 (CN) .......................... 2016 1 1270939

(51) Int. Cl.
*G02F 1/1362* (2006.01)
*G09G 3/36* (2006.01)
*H01L 27/12* (2006.01)
*G02F 1/1343* (2006.01)

(52) U.S. Cl.
CPC .. *G02F 1/136213* (2013.01); *G02F 1/136286* (2013.01); *G09G 3/3648* (2013.01); *H01L 27/124* (2013.01); *G02F 2001/134372* (2013.01)

(58) Field of Classification Search
CPC ......... G02F 1/136213; G02F 1/136286; G02F 2001/134372; H01L 27/124; G09G 3/3648
See application file for complete search history.

(56) References Cited

U.S. PATENT DOCUMENTS

2015/0029433 A1* 1/2015 Takizawa .............. G02F 1/1345
349/43

* cited by examiner

*Primary Examiner* — Phu Vu
(74) *Attorney, Agent, or Firm* — Wang Law Firm, Inc.

(57) ABSTRACT

A pixel structure and a display panel are provided. Wherein, the pixel structure includes a first conductive layer, a second conductive layer and a third conductive layer. The first conductive layer is coupled to a drain electrode of an active switch. The second conductive layer is coupled to a first voltage line. The third conductive layer is coupled to a second voltage line. The first conductive layer, the second conductive layer and the third conductive layer are disposed to be overlapped and at a distance separated from each other. The first conductive layer, the second conductive layer and the third conductive layer are overlapped in a vertical space.

16 Claims, 12 Drawing Sheets

PIXEL STRUCTURE AND DISPLAY PANEL

CROSS-REFERENCE TO RELATED APPLICATION

This application claims the benefit of China Patent Application No. 201611270939.5, filed on Dec. 30, 2016, in the State Intellectual Property Office of the People's Republic of China, the disclosure of which is incorporated herein in its entirety by reference.

BACKGROUND OF THE INVENTION

1. Field of the Invention

The present application is related to a field of display techniques, in particular, is related to a pixel structure and a display panel.

2. Description of the Related Art

Liquid crystal displays (LCDs) have the advantages of relatively thin body, power saving ability and radiationless, thus they are widely used. Most of the LCDs in the present market are backlight type liquid crystal displays, wherein thin film transistor-liquid crystal displays (TFT-LCDs) gradually show their dominance in the field of display.

Generally, a LCD comprises a case, a display panel disposed therein and a backlight module disposed in the case. Wherein, the structure of the display panel is mainly formed by a thin film transistor (TFT) array substrate, a color filter (CF) substrate and a liquid crystal layer disposed between those two substrates. The working principle of those is to apply a drive voltage to two glass substrates to control the rotation of liquid crystal molecules within the liquid crystal layer so as to refract light from the backlight module and to display images.

The present LCDs usually provide data signals by a plurality of pixel electrodes respectively based on image information, then control the transmittance of a plurality of pixel units to display demanded images. In particular, each of pixel electrodes is coupled to data lines and scan lines individually, of which the scan lines are coupled to the pixel electrodes by TFTs. By controlling and turning on the TFTs, the data lines charge the pixel electrodes. However, during the charging process, a plurality of parasitic capacitors may be generated. The plurality of parasitic capacitors may cause the voltage of the pixel electrodes being shared because of crosstalk effect, thereby resulted in insufficient voltage of the pixel electrodes and leads to abnormally colors displayed. Furthermore, along with higher resolution, the crosstalk effect becomes more obvious.

SUMMARY OF THE INVENTION

The technical problem to be solved in the present disclosure is to provide a pixel structure for relieving crosstalk effect.

In addition, the present application further provides a display panel using the pixel structure.

The purpose of the present application is achieved by the technical solutions as follows:

According to an aspect of the present application, the present application discloses a pixel structure. The pixel structure comprises: a first conductive layer coupled to a drain electrode of an active switch, a second conductive layer coupled to a first voltage line, and a third conductive layer coupled to a second voltage line.

The first conductive layer, the second conductive layer and the third conductive layer are disposed to be overlapped and at a distance separated from each other. The first conductive layer, the second conductive layer and the third conductive layer are overlapped with each other in a vertical space.

Wherein, the first voltage line comprises a common line. The common line charges the second conductive layer so that the second conductive layer has an electric potential. This kind of structure is simple.

Wherein, the second voltage line and the common line are disposed to be overlapped in a region covered by the first conductive layer. If two or more lines are disposed in parallel, parasitic capacitors may be generated therebetween. Further, they interfere with each other. However, the generating of the parasitic capacitors may be prevented by disposing the common line and the second voltage line to be overlapped in a region covered by the first conductive layer in the present application, so the ability of interference prevention may be improved.

Wherein, the first voltage line comprises a previous scan line. The charging process of the pixel structure is controlling the active switch to be turned on by the present scan line, which resulted in charging of the pixel structure by the present scan line. The previous scan line is in a previous row of the present scan line. By previously charging the second conductive layer by the previous scan line and make the second conductive layer having a voltage, the charging time may be reduced when the present data line is charging. Further, the second conductive layer may achieve a predetermined electric potential quickly.

Wherein, at least one of the first conductive layer, the second conductive layer and the third conductive layer is formed of a transparent conductive material. As a particular structure disposing the first conductive layer, the second conductive layer and the third conductive layer of the present application, three conductive layers (the first conductive layer, the second conductive layer and the third conductive layer) may all be formed of the transparent conductive material, or may be only one or two of which are formed of the transparent conductive material. The transparent conductive material is not only having good conductive effect, but also having good transmittance.

Wherein, the transparent conductive material comprises indium tin oxide (ITO). However, the transparent conductive material may also be other materials, for instance, a transparent conductive gel.

Wherein, at least one of the first conductive layer, the second conductive layer and the third conductive layer is formed of a conductive metal. All of the first conductive layer, the second conductive layer and the third conductive layer may be formed of the conductive metal. The conductive metal has a good conductive effect.

Wherein, the first conductive layer and the second conductive layer are formed of a conductive metal individually, and the third conductive layer is formed of a conductive gel. As another particular structure disposing the first conductive layer, the second conductive layer and the third conductive layer of the present application, the first conductive layer and the second conductive layer are both formed of the conductive metal of which the conductive metal has good conductive effect; the third conductive layer utilizing the transparent conductive material may also achieve a conductive effect. Further, the transparent conductive material of the present application may be formed of transparent conductive materials such as ITO and transparent conductive gel, which have good transmittance.

Wherein, the first conductive layer is formed of a conductive metal, and the second conductive layer and the third conductive layer are formed of a transparent conductive material individually. As yet another particular structure disposing the first conductive layer, the second conductive layer and the third conductive layer of the present application, the first conductive layer is formed of a conductive metal of which the conductive metal has good conductive effect; the second conductive layer and the third conductive layer formed of the transparent conductive material may also achieve a conductive effect. Further, the transparent conductive material of the present application may be formed of transparent conductive materials such as ITO, transparent conductive gel, which have good transmittance.

Wherein, the first conductive layer is disposed between the second conductive layer and the third conductive layer. As a particular way disposing the third conductive layer, a first storage capacitor is formed between the first conductive layer and the second conductive layer, and a second storage capacitor is formed between the first conductive layer and the third conductive layer. Both storage capacitors (the first storage capacitor, the second storage capacitor) keep the electric potential of the voltage of the pixel structure, and do not affect the voltage of the pixel structure because of the change of the charging voltage of the present data line during charging process, thus crosstalk effect is relieved.

Wherein, the second conductive layer is disposed between the first conductive layer and the third conductive layer. As another particular way disposing the third conductive layer, a first storage capacitor is formed between the first conductive layer and the second conductive layer, and a third storage capacitor is formed between the second conductive layer and the third conductive layer. Both storage capacitors (the first storage capacitor, the third storage capacitor) keep the electric potential of the voltage of the pixel structure, and do not affect the voltage of the pixel structure because of the change of the charging voltage of the present data line during the charging process, thus crosstalk effect is relieved.

According to the other hand of the present application, the present application also discloses a display panel. The display panel comprises a color film substrate and an array substrate. A common line, a data line and a scan line are disposed on the array substrate, wherein the array substrate comprises the pixel structure as mentioned above. The pixel structure is coupled to the data line and the scan line, the pixel structure.

In recent techniques, a plurality of parasitic capacitors may be generated during the charging process of the pixel structure by the data line. The plurality of parasitic capacitors may be shared because of the crosstalk effect, thereby resulted in insufficient voltage of the pixel electrodes and further leads to abnormally colors displayed. In comparison with the recent techniques, the technical features of the present application are:

The pixel structure of the present application comprises three conductive layers, which are a first conductive layer, a second conductive layer, and a third conductive layer. Wherein, the first conductive layer is coupled to a drain electrode of an active switch. The active switch is further coupled to a present data line and a present scan line. By controlling the active switch by the present scan line, the present data line charges the first conductive layer. Wherein, the second conductive layer is coupled to a first voltage line, and the first voltage line charges the second conductive layer. Wherein, the third conductive layer is coupled to the second voltage line, and the second voltage line charges the third conductive layer. As a result, all of three conductive layers may be electrified. By disposing the first conductive layer, the second conductive layer and the third conductive layer to be overlapped and to be at a distance separated from each other, two storage capacitors may be formed. The both storage capacitors keep a pixel voltage value of the pixel structure so as to reduce the influence from a plurality of parasitic capacitors, resulted in relieving of crosstalk effect. Thus, the display panel may display normally.

On the other hand, the present application directly disposes the first conductive layer, the second conductive layer and the third conductive layer to be overlapped so that the capacitance of the pixel structure is significantly increased without adding the plane area of each conductive layer. Thus, the present application is more adapted to a high resolution display panel.

BRIEF DESCRIPTION OF THE DRAWINGS

Appended drawings are to be used for making the embodiments of the present application to be further understood. The drawings form a part of the specification, and are to be used for demonstrating the embodiments of the present application and for explaining the principle of the present application by a combination with the description text. Obviously, the following appended drawings are merely some embodiments of the present application. A person having ordinary skill in the art is able to obtain other drawings according to these appended drawings without under the premise of paying creative labor. In the appended drawings.

DESCRIPTION OF THE PREFERRED EMBODIMENTS

Figure 1:
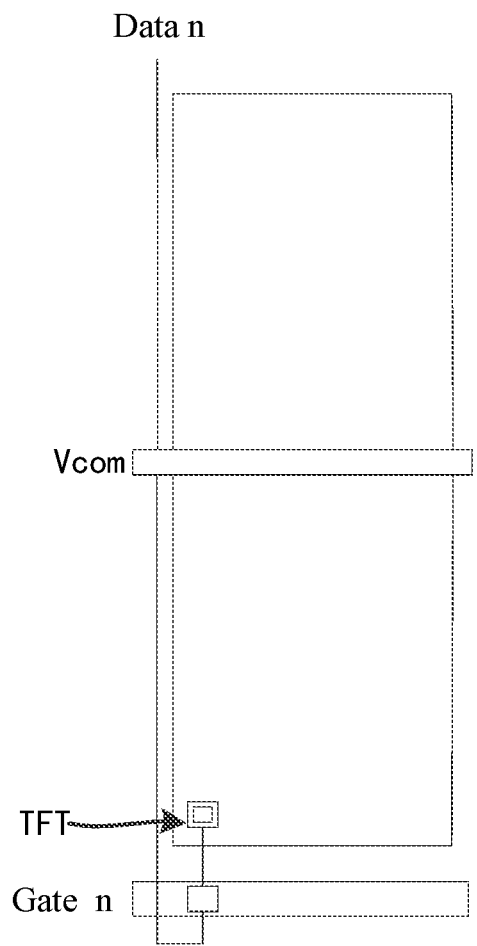
FIG. 1 is a structural schematic view of a pixel structure of the present application.
Figure 2:
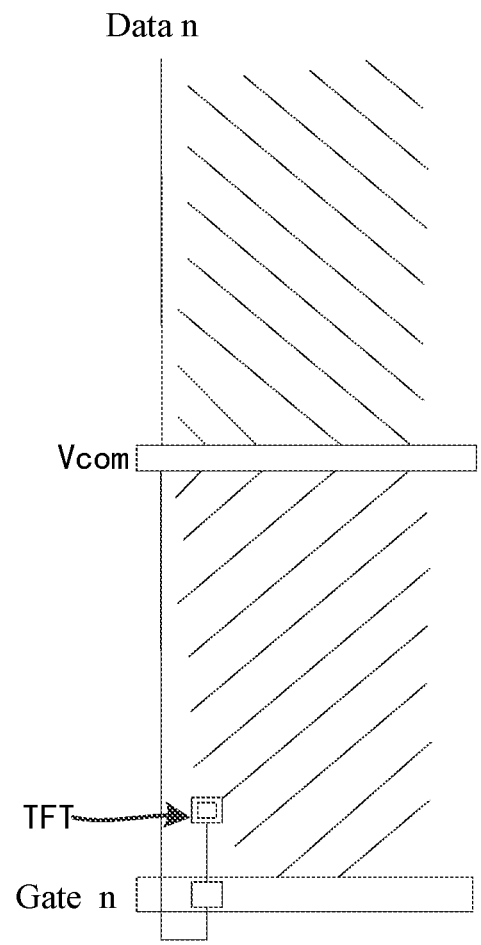
FIG. 2 is a structural schematic view of a pixel structure of the present application.
Figure 3:
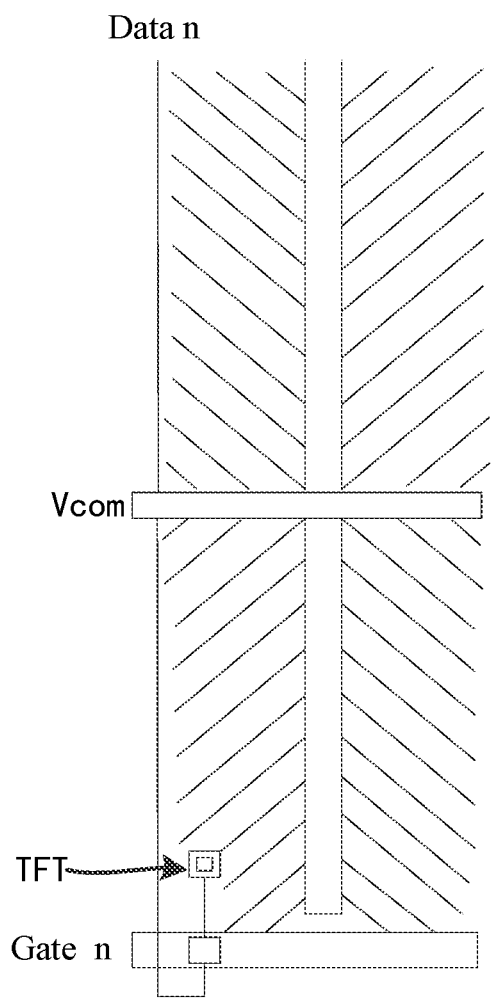
FIG. 3 is a structural schematic view of a pixel structure of the present application.
Figure 4:
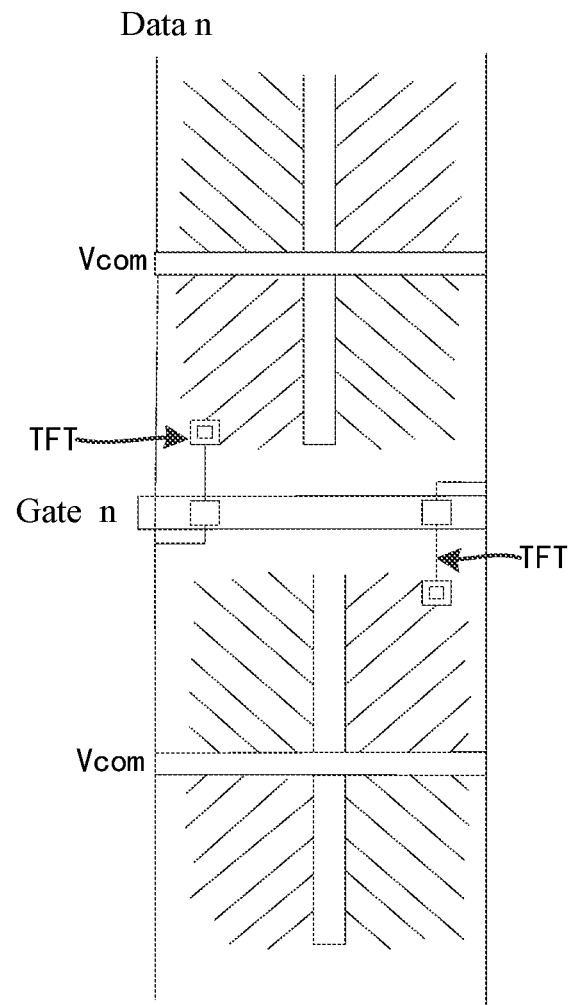
FIG. 4 is a structural schematic view of a pixel structure of the present application.
Figure 5:
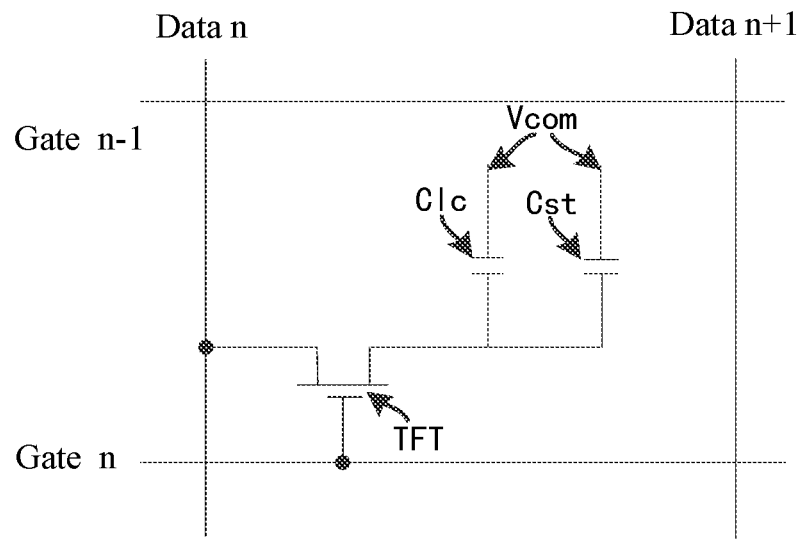
FIG. 5 is a structural schematic view of a pixel structure of the present application.
Figure 6:
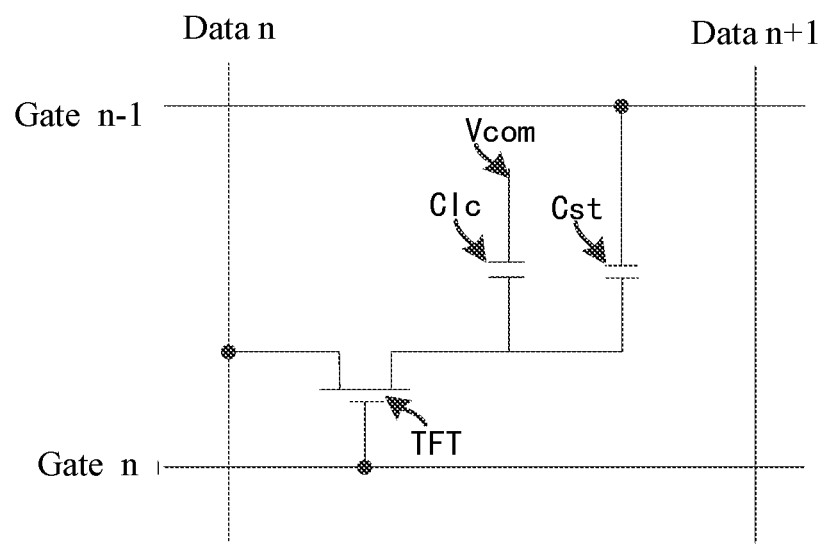
FIG. 6 is a structural schematic view of a pixel structure of the present application.
Figure 7:
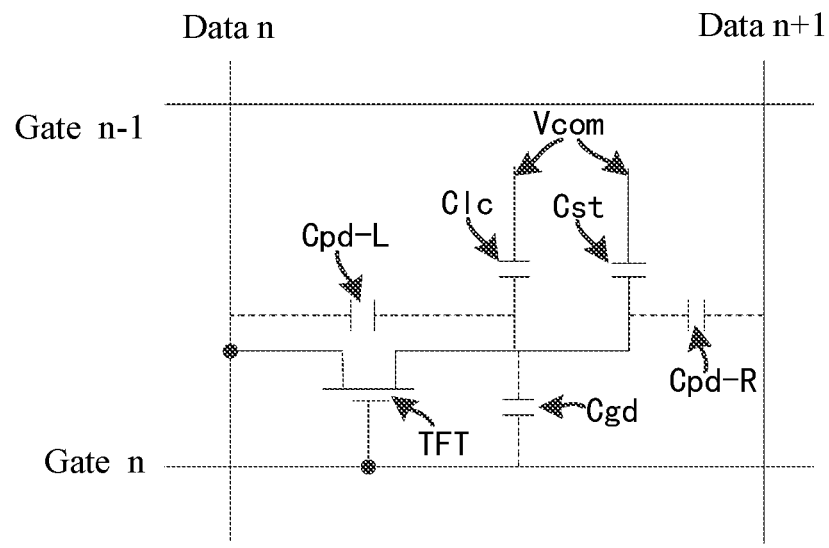
FIG. 7 is a structural schematic view of a pixel structure of the present application.
Figure 8:
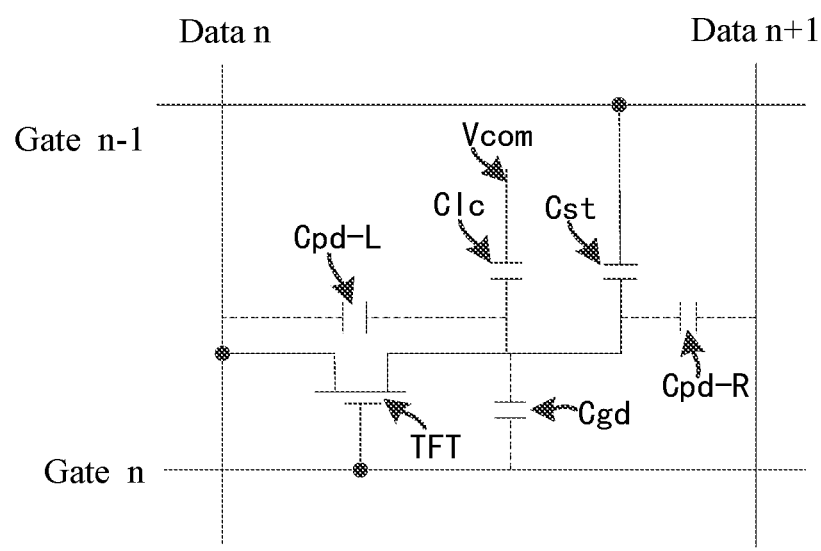
FIG. 8 is a structural schematic view of a pixel structure of the present application.

Features, particular structures and functional details disclosed herein are merely representative, and are for a purpose of describing the exemplary embodiments of the present application. It is to be understood that the present invention may be implemented in different forms, and should not be limited to the embodiments described herein.

In the description of the present application, it is to be under stood that terms of "center", "lateral", "up", "down", "left", "right", "vertical", "horizontal", "top", "bottom", for describing position relationship are based on the relationship shown in the appended drawings. These are used for ease of describing the present application and simplifying the description, but not for indicating or implying that specific devices or elements must be in a specific position, be formed and be operated in a specific direction. Hence, they should not be realized as a limitation of the present application. In addition, the terms of "the first" and "the second" are only used for describing, and should not be realized as indicating or an implying their relative importance or implying a number of specific technical features. Thus, the features limited by "the first" and "the second" may indicate or imply that it comprises one or more of the same features. In the description of the present application, "a plurality of" means two or more than two unless otherwise indicated. Furthermore, the term "comprises" or any derivatives thereof means intended to cover the inclusion without exclusion.

In the description of the present application, it is to be explained that terms of "install", "link", "connect" should be understood broadly unless otherwise regulated or limited. For instance, they may be as a fixed connection, detachably connection, integrally connection, mechanically connection, directly connection, a connection with an intermediate media or a connection within two elements. A person skilled in the related art is able to understand the substantially meaning of the terms in the application according to a substantially case.

The terminologies used herein are only used for describing particular embodiments but not limiting exemplary embodiments. All of terms used herein as a single form such as "a", "one of" also imply a plurality form unless otherwise mentioned. It is to be further understood is that the terms of "comprises" and/or "include" regulating the present of the described features, integers, steps, operations, units and/or components do not exclude the present or adding one or more features, integers, steps, operations, units and/or components.

Here, the pixel structure, the array substrate, the display panel and the display device of the present application are described referring to FIGS. 1-16

Since charging time during a single charging is relatively short, the applicant designs a pixel structure for keeping the voltage Vpixel of the pixel structure, as shown in FIGS. 1-8. In particular, the pixel structures are coupled to a present data line Data n and a present scan line Gate n individually. The present scan line is coupled to the pixel structure by an active switch. The active switch is turned on by the present scan line. The present data line Data n charges the pixel structure. The present data line Data n charges a pixel capacitor Clc and a storage capacitor Cst by its charging voltage (Vdata) during charging the pixel structure. The pixel structure keeps the value of a voltage (Vpixel) of the pixel structure by the storage capacitor Cst so that the display panel may display normally.

The active switch of the present application utilizes such as a thin film transistor (TFT). It has to be explained that the active switch of the present application is not limited only to the TFT.

However, during the display process of the display panel, various gray scales may be displayed. The voltage of present dada line Data n charging the pixel structure may be varied continuously, so that the voltage of the pixel structure may be varied correspondingly. Since several parasitic capacitors (Cpd-L, Cgd and Cpd-R) are presented because of the charging voltage of the present data line and the pixel structure presents, as dotted lines shown in FIGS. 7-8, the capacitors between the dotted lines are the several parasitic capacitors of which the several parasitic capacitors (Cpd-L, Cgd and Cpd-R) may lead to the sharing of the voltage of the pixel structure because of crosstalk effect, and may result in insufficient voltage of the pixel structure and further lead to abnormally colors displayed.

For reducing the influence of the several parasitic capacitors and reliving the influence of the crosstalk effect, the applicant further utilizes two methods as follows.

The first of which is to dispose the data line far away from the pixel structure so as to reduce the generating of parasitic capacitors and to further reduce the influence of the crosstalk effect. However, this increases the plane area of the display panel, so it is not easy to be used in a display panel having higher resolution.

The second of which is to increase the storage capacitor Cst and to make it far larger than the parasitic capacitors (Cpd-L, Cgd and Cpd-R) so as to reduce the influence of the crosstalk effect. However, the conductive layer within the storage capacitor should be increased so that the plane area of the pixel structure may be increased. Along with higher resolution, the spaces for pixel electrodes may be smaller and the disposition of the storage capacitors may be smaller. Hence, increasing the volume of the storage capacitors is also not easy to be used in a display panel having higher resolution. Since the limitation of the plane area of the storage capacitors, the reduced efficiency of the crosstalk effect achieved by increasing the storage capacitors is also reduced.

Hence, the applicant designs another technical solution to solve the above problems. In particular, as follows:

Here, FIGS. 9-16 are used for detailed description of the present application in a combination with preferred embodiments.

As shown in FIGS. 9-16, an embodiment of the present application discloses a pixel structure. The pixel structure of the present embodiment may be as several types. The several kinds of the pixel structure may be applied in various types of display devices individually. For instance, the pixel structure of the present application may be applied in several types display devices as follows: Twisted Nematic (TN) type, Super Twisted Nematic (STN) type, In-Plane Switching (IPS) type, Vertical Alignment (VA) type, High Vertical Alignment (HVA) type, and curve surface type display panels.

Figure 9:
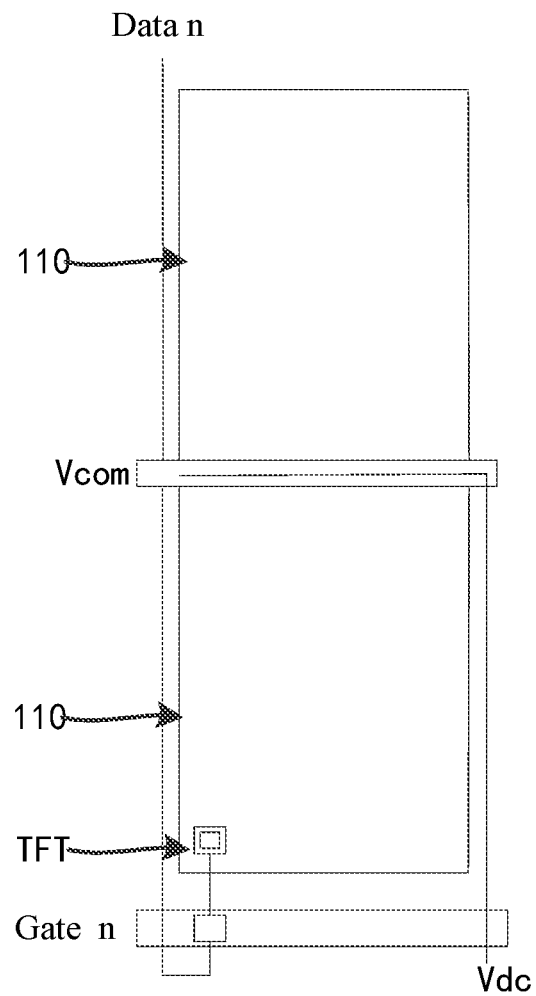
FIG. 9 is a structural schematic view of a pixel structure of the present application.
Figure 10:
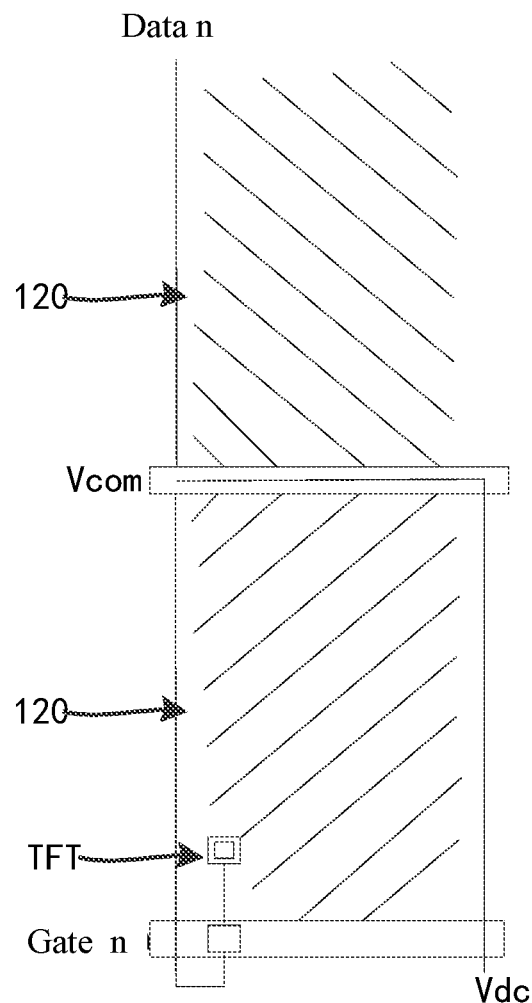
FIG. 10 is a structural schematic view of a pixel structure of an embodiment of the present application.
Figure 11:
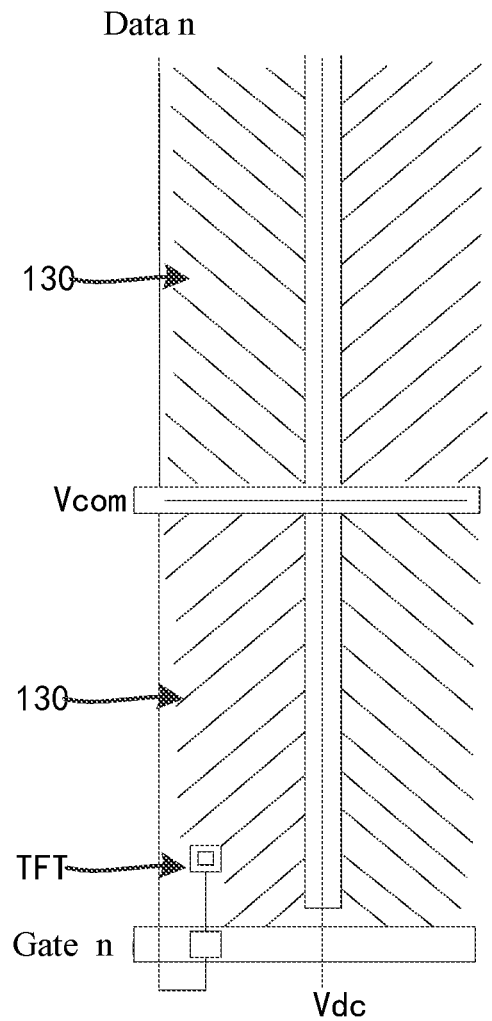
FIG. 11 is a structural schematic view of a pixel structure of an embodiment of the present application.
Figure 12:
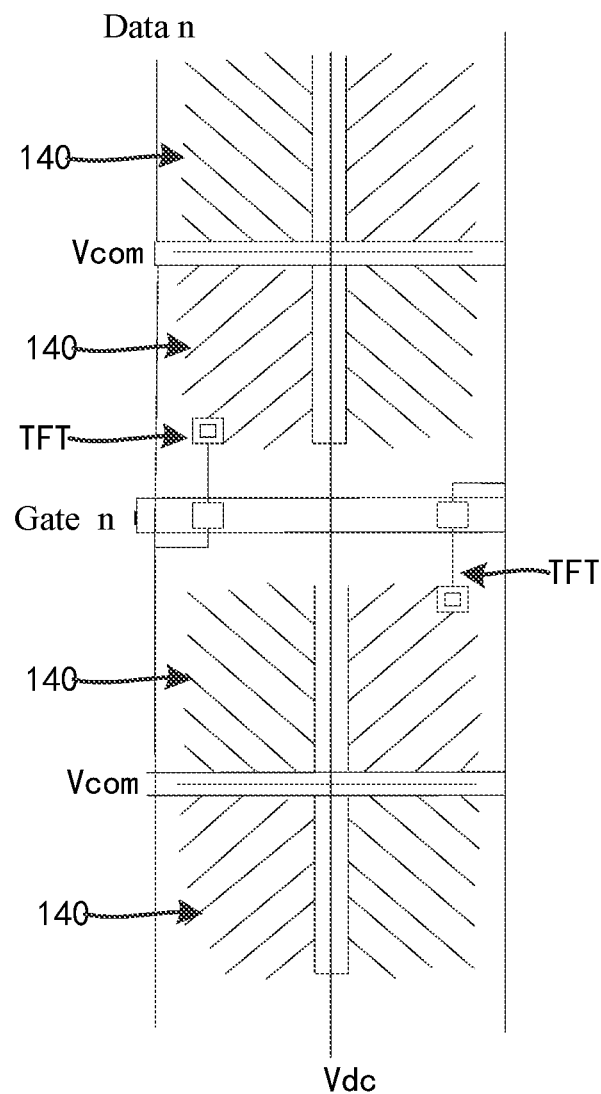
FIG. 12 is a structural schematic view of a pixel structure of an embodiment of the present application.

In particular, the pixel structures of embodiments of the present application may be 4 different types of pixel structures as shown in FIGS. 9-12. It has to be explained that FIGS. 9-12 are only several example types of the pixel structures of the embodiments of the present application for description. The pixel structures of embodiments of the present application are not limited to these 4 types of structures. The pixel structures of the embodiments of the present application comprises a pixel electrode, wherein FIG. 9 shows a pixel structure of the present application of which the pixel structure comprises a first pixel electrode 110; FIG. 10 shows another pixel structure of the present application of which the pixel structure comprises a second pixel electrode 120; FIG. 11 shows yet another pixel structure of the present application of which the pixel structure comprises a third pixel electrode 130; FIG. 12 shows yet another pixel structure of the present application of which the pixel structure of which the pixel structure comprises a fourth pixel electrode 140.

Figure 15:
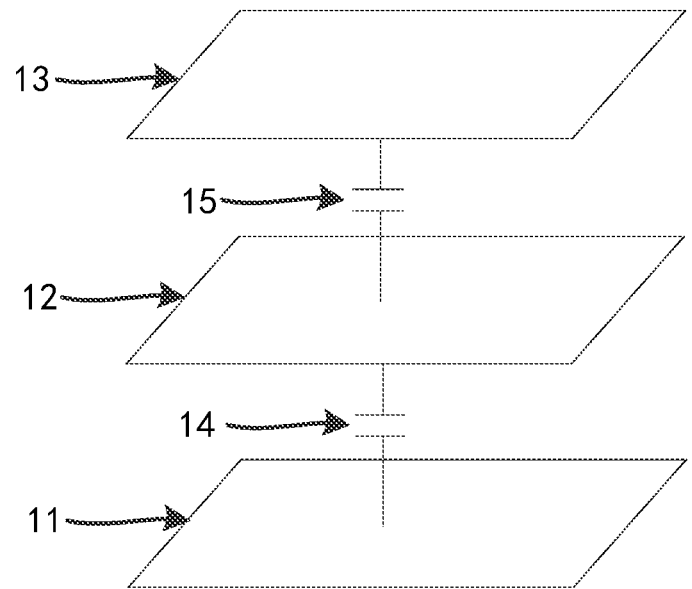
FIG. 15 is a schematic view of the arrangement of a first conductive layer, a second conductive layer and a third conductive layer of an embodiment of the present application.
Figure 16:
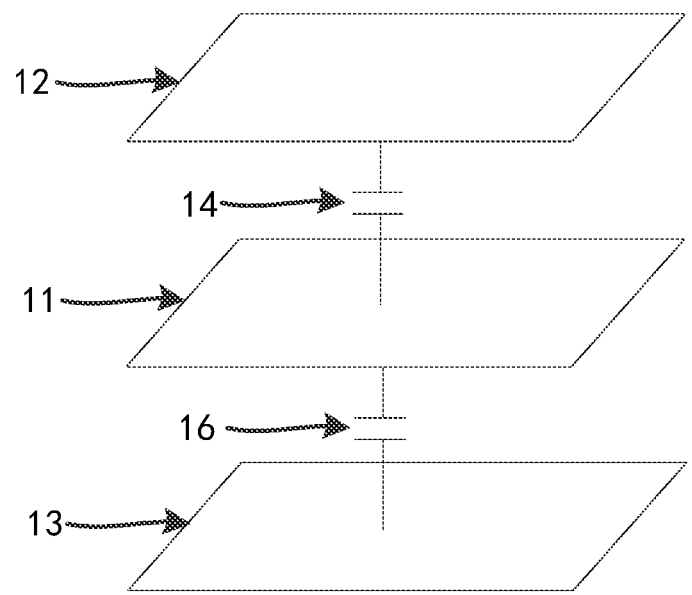
FIG. 16 is a schematic view of the arrangement of a first conductive layer, a second conductive layer and a third conductive layer of an embodiment of the present application.

Further, the pixel structure of the embodiments of the present application comprises a first conductive layer 11, a second conductive layer 12 and a third conductive layer 13. As shown in FIGS. 15 and 16, the first conductive layer 11 is coupled to a drain electrode of an active switch (e.g. TFT, but is not limited to TFT). The second conductive layer 12 is coupled to a first voltage line. The third conductive layer 13 is coupled to a second voltage line. The first conductive layer 11, the second conductive layer 12 and the third conductive layer 13 are all disposed to be overlapped and at a distance separated from each other. The first conductive layer, the second conductive layer and the third conductive layer are overlapped with each other in a vertical space.

In comparison with the recent techniques, the three conductive layer of the pixel structure of the embodiments of the present application may all be electrified and three of which may form two storage capacitors. The two storage capacitors may keep the pixel voltage value of the pixel structure simultaneously so as to reduce the influences of the several parasitic capacitors, and further to relive the influence of crosstalk effect. Thus the display panel may display normally.

Furthermore, the embodiments of the present application keep the value of the pixel structure by the two storage capacitors may have better effect for keeping the voltage value of the pixel structure and may make the voltage value more stable in comparison with the pixel strictures shown in FIGS. 1-8, which keep the voltage value of the pixel structure by one storage capacitor. Simultaneously, the embodiments of the present application directly dispose the first conductive layer, the second conductive layer and the third conductive layer to be overlapped so that they are no need of increasing the plane area of each conductive layer. Hence, the embodiments of the present application may greatly increase the capacitance of the pixel structure without improve the plane area of each conductive layer. Thus, the voltage value of the pixel structure may be kept better so that the application may be more adapted to a display panel having high resolution.

In an embodiment of the present application as shown in FIG. 16, FIG. 16 is a particular way of overlapping the first conductive layer, the second conductive layer and the third conductive layer. In particular, a first conductive layer 11 is disposed between a second conductive layer 12 and a third conductive layer 13, so that a first storage capacitor 14 is formed between the first conductive layer 11 and the second conductive layer 12. As shown in a combination of FIGS. 13 and 14, the first storage capacitor 14 is the storage capacitor Cst. When the pixel structure utilizes a structure as shown in FIG. 16, in this case, the storage capacitor Cst is defined as a storage capacitor 14. A second storage capacitor 16 is formed between the first conductive layer 11 and the third conductive layer 13. The second storage capacitor 16 is a storage capacitor Cnew, in this case, the storage capacitor Cnew is defined as the second storage capacitor 16. Hence, the two storage capacitors (the first storage capacitor 11, the second storage capacitor 16) both keep the electric potential of the voltage of the pixel structure without affecting the voltage of the pixel structure because of the change of the charging voltage of the present data line during the charging process, thus relive crosstalk effect.

Figure 13:
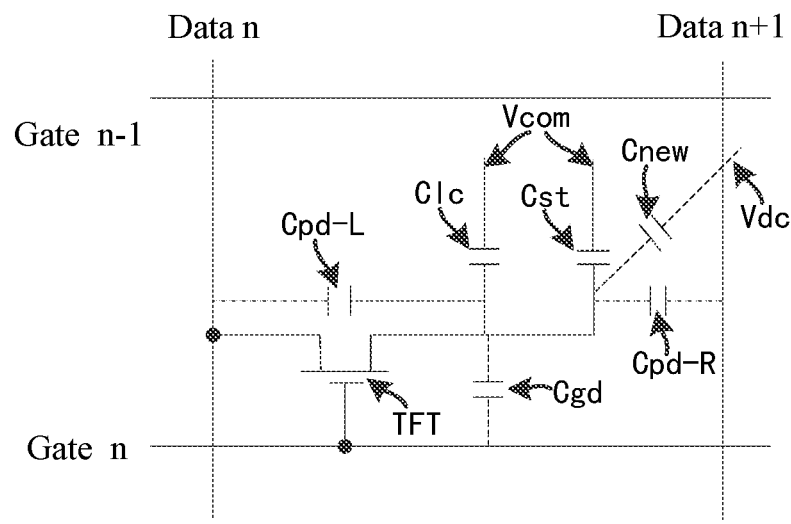
FIG. 13 is a structural schematic view of a pixel structure of an embodiment of the present application.
Figure 14:
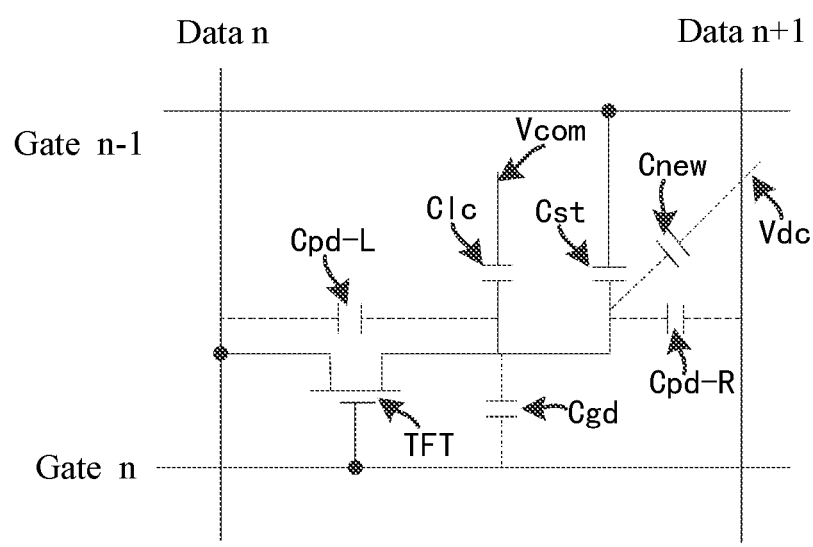
FIG. 14 is a structural schematic view of a pixel structure of an embodiment of the present application.

However, it has to be explained that FIG. 16 is merely a particular conductive layer structure arrangement, and it may be other kinds of structure arrangement. For instance, as shown in FIG. 15, FIG. 16 is another particular way of overlapping the first conductive layer, the second conductive layer and the third conductive layer. In particular, a second conductive layer 12 is disposed between a first conductive layer 11 and a third conductive layer 13, so that the same storage capacitor as shown in FIG. 16 may be formed between the first conductive layer 11 and the second conductive layer 12, that is, the first storage capacitor 14. Similarly, as shown in a combination of FIGS. 13 and 14, the first storage capacitor is the storage capacitor Cst, in this case, the storage capacitor Cst is defined as the first storage capacitor 14. A third storage capacitor 15 is formed between the second conductive layer 12 and the third conductive layer 13. Similarly, as shown in a combination of FIGS. 13 and 14, the third storage capacitor 15 may be indicated as the storage capacitor Cnew (however, it has to be explained that since only one new storage capacitor may be indicated in FIGS. 13 and 14, that is, the second storage capacitor or the third storage capacitor, hence, the Cnew in FIGS. 13 and 14 are merely used for explaining the second storage capacitor or the third storage capacitor. In this case, the second storage capacitor and the third storage capacitor are not the same), in this case, when the pixel structure utilizes the structure shown in FIG. 15, the storage capacitor Cnew is defined as the third storage capacitor 15. Hence the two storage capacitors (the first storage capacitor 11, the second storage capacitor 16) both keep the electric potential of the voltage of the pixel structure without affecting the voltage of the pixel structure because of the change of the charging voltage of the present data line during the charging process, thus relive crosstalk effect.

In the following descriptions, the second storage capacitor and the third capacitor will be replaced by Cnew in the present embodiment.

As shown in FIGS. 13 and 14, the first conductive layer 11 is coupled to the drain electrode of an active switch. An end of a pixel capacitor Clc is coupled to a common line Vcom. The pixel capacitor Clc is coupled to the active switch. The active switches are coupled to a present data line Data n and a present scan line Gate n, individually. When the present scan line controlling to open the active switches, the present data line charges the pixel structure through the active switches.

Further, the first voltage line comprises a previous scan line Gate n−1. As shown in FIG. 14, that is, the second conductive layer 12 is coupled to the previous scan line. The charging process of the pixel structure is controlling the active switch to be turned on by the present scan line Gate n, so that the present data line Data n charges the pixel structure. The previous scan line is in a previous row of the present scan line. By previously charging the second conductive layer 12 by the previous scan line and make the second conductive layer 12 having a voltage, the charging time may be reduced when the present data line is charging. Further, the second conductive layer may achieve a predetermined electric potential quickly. This is a particular way that the conductive layer couples with the first voltage line.

Surely, it has to be explained that the second conductive layer may also be coupled to other first voltage lines. For instance, as shown in FIG. 13, the first voltage line comprises a common line Vcom, that is, the second conductive layer 12 is coupled to the common line Vcom, and the common line Vcom charges the second conductive layer. The structure of this way is easy.

In an embodiment of the present application, the third conductive layer 13 is coupled to the second voltage line. As shown in FIGS. 9-14, the second voltage line Vdc of an embodiment of the present application is coupled to a DC voltage. The voltage range of the common line which the second conductive layer is connected is, for example, 7.5V to 0V; the voltage range of the data line is −5 to 15V; the voltage range of the scan line is −6 to 35V. Since the voltage of the third conductive layer connected with the second voltage line is different from all of the voltages of the first conductive layer and the second conductive layer, a storage capacitor may be formed between the third conductive layer and the first conductive layer or the second conductive layer.

In the embodiment of the present application, a single pixel structure utilizes three conductive layers to form a plurality of storage capacitors. It has to be explained that the embodiments of the present application are not limited to this. For instance, more conductive layers (four or more than four conductive layers) may be formed in the pixel structure, and more storage capacitors (the fourth storage capacitor and the fifth storage capacitor) may be formed in the pixel structure.

In an embodiment of the present application, wherein the first conductive layer 11, the second conductive layer 12 and the third conductive layer 13 are formed by conductive metals individually. This is a particular structure of the disposition of the first conductive layer, the second conductive layer and the third conductive layer of the present application. Three conductive layers (the first conductive layer 11, the second conductive layer 12 and the third conductive layer 13) are formed of the conductive metals. The conductive metals have good conductive effect. Wherein, the conductive metals of the embodiment of the present application may be: aluminum, molybdenum, copper, titanium, silver or an alloy of a combination thereof.

It has to be explained that three conductive layers (the first conductive layer 11, the second conductive layer 12 and the third conductive layer 13) formed of the conductive metals is a particular way of the embodiment of the present application. The embodiment of the present application may utilize other ways.

Example 1 the first conductive layer 11 and the second conductive layer 12 are formed of the conductive metals individually, and the third conductive layer 13 is formed of a conductive material. As another particular structure disposing the first conductive layer 11, the second conductive layer 12 and the third conductive layer 13 of the present application, the first conductive layer 11 and the second conductive layer 12 are both formed of the conductive metal of which the conductive metal has good conductive effect; the third conductive layer 13 formed of the transparent conductive material may also achieve a conductive effect. Further, the transparent conductive material of the present application may be formed of transparent conductive materials such as ITO, transparent conductive gel, which have good transmittance.

Example 2 the first conductive layer 11 is formed of a conductive metal, and the second conductive layer 12 and the third conductive layer 13 are formed of a transparent conductive material individually. As yet another particular structure disposing the first conductive layer 11, the second conductive layer 12 and the third conductive layer 13 of the present application, the first conductive layer 11 is formed of a conductive metal of which the conductive metal has good conductive effect; the second conductive layer 12 and the third conductive layer 13 formed of the transparent conductive material may also achieve a conductive effect. Further, the transparent conductive material of the present application may be formed of transparent conductive materials such as ITO, transparent conductive gel, which have good transmittance.

Example 3 the first conductive layer 11, the second conductive layer 12 and the third conductive layer 13 are formed of a transparent material individually. As yet another particular structure disposing the first conductive layer 11, the second conductive layer 12 and the third conductive layer 13 of the present application, all of the first conductive layer 11, the second conductive layer 12 and the third conductive layer 13 formed of the transparent conductive material may also achieve a conductive effect. Further, the transparent conductive material of the present application may be formed of transparent conductive materials such as ITO, transparent conductive gel, which have good transmittance.

In an embodiment of the present application, as shown in FIGS. 9-12, the second voltage line Vdc and the common line Vcom are partially overlapped spatially. In particular, the second voltage line is disposed to be overlapped with the common line in a region covered by the first conductive layer. If two or more lines are disposed in parallel, parasitic capacitors may be generated therebetween. Further, they interfere with each other. However, the generating of the parasitic capacitors may be prevented by disposing the common line Vcom and the second voltage line Vdc to be overlapped in a region covered by the first conductive layer in the present application, so the ability of interference prevention may be improved.

Furthermore, the three conductive layers (the first conductive layer 11, the second conductive layer 12 and the third conductive layer 13) of an embodiment of the present application are parallel to each other. Hence, they occupy smaller area of a plane space so that the effect of applying the pixel structure of the embodiment of the present application to a display panel is better.

In another embodiment of the present application, the embodiment of the present application further discloses an array substrate. A common line, a data line and a scan line are disposed on the array substrate. The array substrate further comprises a pixel structure. The pixel structure is coupled to the data line and the scan line individually. Wherein, the common line, the data line, the scan line and the pixel structure of the array substrate of the present embodiment may be referred to the common line, the data line, the scan line and the pixel structure mentioned in the above embodiments, or the common line, the data line, the scan line and the pixel structure of the array substrate of the array substrate of the present embodiment may be referred to the common line, the data line, the scan line and the pixel structure, the cooperation and the relationship therebetween as shown in FIGS. 9-16. The array substrate of the present embodiments has a plurality of pixel structures and each of which may referred to FIGS. 9-16. The description of the pixel structure, the common line, the data line and the scan line are omitted here.

In yet another embodiment of the present application, the embodiment of the present application further discloses a display panel. The display panel comprises a color film substrate and an array substrate. A common line, a data line and a scan line are disposed on the array substrate. The array substrate further comprises a pixel structure. The pixel structure is coupled to the data line and the scan line, the pixel structure individually. Wherein, the common line, the data line, the scan line and the pixel structure of the array substrate of the present embodiment may be referred to the common line, the data line, the scan line and the pixel structure mentioned in the above embodiments, or the common line, the data line, the scan line and the pixel structure of the array substrate of the array substrate of the present embodiment may be referred to the common line, the data line, the scan line and the pixel structure, the cooperation and the relationship therebetween as shown in FIGS. 9-16. The array substrate of the present embodiments has a plurality of pixel structures and each of which may referred to FIGS. 9-16. The description of the pixel structure, the common line, the data line and the scan line are omitted here.

In yet another embodiment of the present application, the embodiment of the present application further discloses a display device. The display device comprises a display panel and a backlight module. Wherein, the display panel comprises a color film substrate and an array substrate. A common line, a data line and a scan line are disposed on the array substrate. The array substrate further comprises a pixel structure. The pixel structure is coupled to the data line and the scan line, the pixel structure individually. Wherein, the common line, the data line, the scan line and the pixel structure of the array substrate of the present embodiment may be referred to the common line, the data line, the scan line and the pixel structure mentioned in the above embodiments, or the common line, the data line, the scan line and the pixel structure of the array substrate of the array substrate of the present embodiment may be referred to the common line, the data line, the scan line and the pixel structure, the cooperation and the relationship therebetween as shown in FIGS. 9-16. The array substrate of the present embodiments has a plurality of pixel structures and each of which may referred to FIGS. 9-16. The description of the pixel structure, the common line, the data line and the scan line are omitted here. Wherein, the display device of the present embodiment may be a liquid crystal display (LCD) or other types of display device. When the display device is a LCD, the backlight module may be used as a light source for applying sufficient brightness and distributing even light source. The backlight module of the present embodiment may be a frontlight type, or may also be a backlight type. It has to be explained that the backlight modules of the present embodiment are not limited to these.

The aforementioned contents are detailed description of the present application by a combination of particular preferred embodiments. The present application is not limited to these descriptions of the embodiments. A person skilled in the related art is able to know that any simple modifications and alterations which do not depart from the concept of the present application are intended to be comprised within the scope of the appended claims.

What is claimed is:

1. A pixel structure, comprising:
a first conductive layer coupled to a drain electrode of an active switch;
a second conductive layer coupled to a first voltage line; and
a third conductive layer coupled to a second voltage line;
wherein the first conductive layer, the second conductive layer and the third conductive layer are disposed to be overlapped and at a distance separated from each other; the first conductive layer, the second conductive layer and the third conductive layer are overlapped with each other in a vertical space;
wherein the second voltage line and a common line are disposed to be overlapped in a region covered by the first conductive layer; the first voltage line comprises a previous scan line; at least one of the first conductive layer, the second conductive layer and the third conductive layer is formed of a transparent conductive material; the transparent conductive material comprises indium tin oxide (ITO); and
wherein at least one of the first conductive layer, the second conductive layer and the third conductive layer is formed of a conductive metal; and the first conductive layer is disposed between the second conductive layer and the third conductive layer.

2. A pixel structure, comprising:
a first conductive layer coupled to a drain electrode of an active switch;
a second conductive layer coupled to a first voltage line; and
a third conductive layer coupled to a second voltage line;
wherein the first conductive layer, the second conductive layer and the third conductive layer are disposed to be overlapped and at a distance separated from each other; and the first conductive layer, the second conductive layer and the third conductive layer are overlapped with each other in a vertical space;
wherein the first voltage line comprises a previous scan line.

3. The pixel structure as in claim 2, wherein the second voltage line and a common line are disposed to be overlapped in a region covered by the first conductive layer.

4. The pixel structure as in claim 2, wherein at least one of the first conductive layer, the second conductive layer and the third conductive layer is formed of a transparent conductive material.

5. The pixel structure as in claim 4, wherein the transparent conductive material comprises indium tin oxide (ITO).

6. The pixel structure as in claim 2, wherein at least one of the first conductive layer, the second conductive layer and the third conductive layer is formed of a conductive metal.

7. The pixel structure as in claim 2, wherein the first conductive layer is disposed between the second conductive layer and the third conductive layer.

8. The pixel structure as in claim 2, wherein the second conductive layer is disposed between the first conductive layer and the third conductive layer.

9. The pixel structure as in claim 6, wherein the second conductive layer is disposed between the first conductive layer and the third conductive layer.

10. A display panel, comprising:
a color film substrate and an array substrate;
wherein a common line, a data line and a scan line are disposed on the array substrate;

wherein the array substrate comprises a pixel structure coupled to the data line and the scan line;

wherein the pixel structure comprises:

a first conductive layer coupled to a drain electrode of an active switch;

a second conductive layer coupled to a first voltage line; and a third conductive layer coupled to a second voltage line;

wherein the first conductive layer, the second conductive layer and the third conductive layer are disposed to be overlapped and at a distance separated from each other; and wherein the first conductive layer, the second conductive layer and the third conductive layer are overlapped with each other in a vertical space;

wherein the first voltage line comprises a previous scan line.

11. The display panel as in claim 10, wherein the second voltage line and the common line are disposed to be overlapped in a region covered by the first conductive layer.

12. The display panel as in claim 10, wherein at least one of the first conductive layer, the second conductive layer and the third conductive layer is formed of a transparent conductive material.

13. The display panel as in claim 12, wherein the transparent conductive material comprises indium tin oxide (ITO).

14. The display panel as in claim 10, wherein at least one of the first conductive layer, the second conductive layer and the third conductive layer is formed of a conductive metal; and the second conductive layer is disposed between the first conductive layer and the third conductive layer.

15. The display panel as in claim 10, wherein the first conductive layer is disposed between the second conductive layer and the third conductive layer.

16. The display panel as in claim 10, wherein the second conductive layer is disposed between the first conductive layer and the third conductive layer.

* * * * *